(12) United States Patent
Chen et al.

(10) Patent No.: US 7,572,691 B2
(45) Date of Patent: Aug. 11, 2009

(54) NON-VOLATILE MEMORY AND METHOD OF FABRICATING THE SAME

(75) Inventors: Chin-Hsien Chen, Hsinchu (TW);
Ying-Tso Chen, Hsinchu (TW);
Chien-Hung Liu, Hsinchu (TW);
Shou-Wei Huang, Hsinchu (TW)

(73) Assignee: MACRONIX International Co., Ltd, Hsinchu (TW)

( * ) Notice: Subject to any disclaimer, the term of this patent is extended or adjusted under 35 U.S.C. 154(b) by 443 days.

(21) Appl. No.: 11/435,458

(22) Filed: May 16, 2006

(65) Prior Publication Data
US 2007/0269943 A1 Nov. 22, 2007

(51) Int. Cl.
*H01L 21/336* (2006.01)
*H01L 21/8234* (2006.01)

(52) U.S. Cl. .................. 438/197; 438/558; 438/561

(58) Field of Classification Search .............. 438/591, 438/151, 275, 197, 558, 561; 365/185.24
See application file for complete search history.

(56) References Cited

U.S. PATENT DOCUMENTS 5,460,987 A * 10/1995 Wen et al. ............... 438/151
5,668,031 A * 9/1997 Hsue et al. ............... 438/275
6,458,677 B1 * 10/2002 Hopper et al. ............ 438/591
7,352,631 B2 * 4/2008 Burnett et al. ......... 365/185.24

* cited by examiner

*Primary Examiner*—Thanh V Pham
*Assistant Examiner*—Errol Fernandes
(74) *Attorney, Agent, or Firm*—J.C. Patents

(57) ABSTRACT

A method of fabricating a non-volatile memory is provided. First, two openings are formed on a substrate. A stacked gate structure comprising a first dielectric layer, a charge storage layer, a second dielectric layer and a first conductive layer is formed on the substrate between the two openings. A liner is formed on a bottom and a portion of a sidewall of the tow openings, wherein a top surface of the liner is lower than that of the substrate. A second conductive layer is formed on the liner at the bottom of the two openings, wherein a top surface of the second conductive layer is co-planar with that of the liner. A third conductive layer is formed on the second conductive layer and the liner, wherein a top surface of the third conductive layer is co-planar with that of the substrate and lower than that of the first dielectric layer.

11 Claims, 3 Drawing Sheets

112 122 126 132
        140

NON-VOLATILE MEMORY AND METHOD OF FABRICATING THE SAME

BACKGROUND OF THE INVENTION

1. Field of the Invention

The present invention generally relates to a semiconductor device and method of fabricating the same, and more particularly, to a non-volatile memory and method of fabricating the same.

2. Description of Related Art

As the IC industry advances rapidly, device dimensions are continuously reduced to achieve higher integration, so is the distance between adjacent devices. However, when the distance is decreased to a certain limit, undesirable interference between adjacent devices occurs. Therefore, methods for fabricating semiconductor devices of high integration with reduced dimensions but good electrical properties are desired.

However, as the integration of a semiconductor device gradually increases, the distance between the neighboring source and drain reduces, and this may result in some problems. For example, the source and the drain are formed by an ion implantation process. Once the implanted dopant diffuses, a punch through between the neighboring source and drain may easily occur due to diffusion of the implanted dopant. Consequently, an abnormal electrical conduction between the neighboring source and drain may occur which leads to poor operation speed and efficiency of the device. Furthermore, short or an open of the device is resulted, wherein the reliability and the yield of the entire process may be affected.

SUMMARY OF THE INVENTION

Accordingly, the present invention is directed to a non-volatile memory for preventing the dopant of the conventional source and drain from diffusion, which leads to the problem of punch through.

The present invention also provides a non-volatile memory to prevent the occurrence of punch through, which affects the efficiency of the device and the reliability of the entire process.

As embodied and broadly described herein, the present invention provides a method of fabricating a non-volatile memory comprising the following steps. First, two openings are formed on a substrate. Then, a stacked gate structure comprising a first dielectric layer, a charge storage layer, a second dielectric layer and a first conductive layer is formed on the substrate between the two openings. Next, a liner is formed on a bottom of each of the two openings and a portion of a sidewall of each of the two openings, wherein a top surface of the liner is lower than that of the substrate. Then, a second conductive layer is formed on the liner at the bottom of each of the two openings, wherein a top surface of the second conductive layer is co-planar with that of the liner. Finally, a third conductive layer is formed on the second conductive layer and the liner, wherein a top surface of the third conductive layer is at least co-planar with that of the substrate and lower than that of the first dielectric layer.

According to an embodiment of the present invention, the method of forming the liner comprises an in-situ steam generated (ISSG) process or a chemical vapor deposition process. And a material of the liner comprises silicon dioxide, silicon nitride or silicon oxynitride.

According to an embodiment of the present invention, a material of the second conductive layer comprises doped polysilicon.

According to an embodiment of the present invention, the method of forming the third conductive layer comprises the steps of forming a conductive material layer on the substrate to at least fill the two openings and then removing a portion of the conductive material layer until a top surface of the conductive material layer is at least co-planar with the top surface of the substrate and lower than the top surface of the first dielectric layer.

According to an embodiment of the present invention, a material of the third conductive layer comprises doped polysilicon.

According to an embodiment of the present invention, a material of the charge storage layer comprises silicon dioxide, silicon nitride or silicon oxynitride.

According to an embodiment of the present invention, a material of the first dielectric layer comprises silicon dioxide or other suitable dielectric material.

According to an embodiment of the present invention, a material of the second dielectric layer comprises silicon dioxide or other suitable dielectric material.

According to an embodiment of the present invention, a material of the first conductive layer comprises poly silicon or doped polysilicon.

As embodied and broadly described herein, the present invention also provides a non-volatile memory comprising a substrate, a stacked gate structure, a liner, a second conductive layer and a third conductive layer. The substrate comprises two openings. The stacked gate structure is disposed on the substrate between the two openings, wherein the stacked gate structure comprises a first dielectric layer, a charge storage layer, a second dielectric layer and a first conductive layer sequentially stacked on the substrate. The liner is disposed on a bottom of each of the two openings and a portion of a sidewall of each of the two openings, and a top surface of the liner is lower than a top surface of the substrate. The second conductive layer is disposed on the liner at the bottom of each of the two openings, and a top surface of the second conductive layer is co-planar with the top surface of the liner. The third conductive layer is disposed on the second conductive layer and the liner, wherein a top surface of the third conductive layer is at least co-planar with the top surface of the substrate and lower than a top surface of the first dielectric layer.

According to an embodiment of the present invention, a material of the second conductive layer comprises doped polysilicon.

According to an embodiment of the present invention, a material of the third conductive layer comprises doped polysilicon.

According to an embodiment of the present invention, a material of the liner comprises silicon dioxide, silicon nitride or silicon oxynitride.

According to an embodiment of the present invention, a material of the charge storage layer comprises silicon nitride. In another embodiment, a material of the charge storage layer comprises polysilicon or doped polysilicon.

According to an embodiment of the present invention, a material of the first dielectric layer comprises silicon dioxide or other suitable dielectric material.

According to an embodiment of the present invention, a material of the second dielectric layer comprises silicon dioxide or other suitable dielectric material.

According to an embodiment of the present invention, a material of the first conductive layer comprises poly silicon or doped poly silicon.

The present invention is to form the openings in the substrate, and to form the liner and the conductive layers serving as the source/drain region of the devices in the openings. Accordingly, the present invention may prevent the dopant from diffusion, which causes the punch through, when the source/drain region is formed by ion-implantation. Thus, the reliability and the yield of the non-volatile memory may be improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
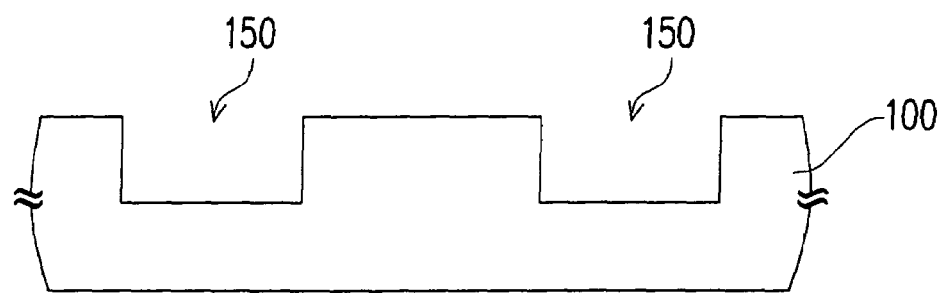
FIGS. 1A to 1E are schematic, cross-sectional diagrams illustrating the process flow for fabricating a non-volatile memory according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1E are schematic, cross-sectional diagrams illustrating the process flow for fabricating a non-volatile memory according to an embodiment of the present invention.

First, referring to FIG. 1A, two openings 150 are formed in the substrate 100. The openings 150 may be formed by the following steps. A patterned photoresist layer (not shown) is formed on the substrate 100. Then, a portion of the substrate 100 which is not covered by the patterned photoresist layer is removed, such that the openings 150 are formed in the substrate 100. Then, the patterned photoresist layer is removed.

Figure 1B:
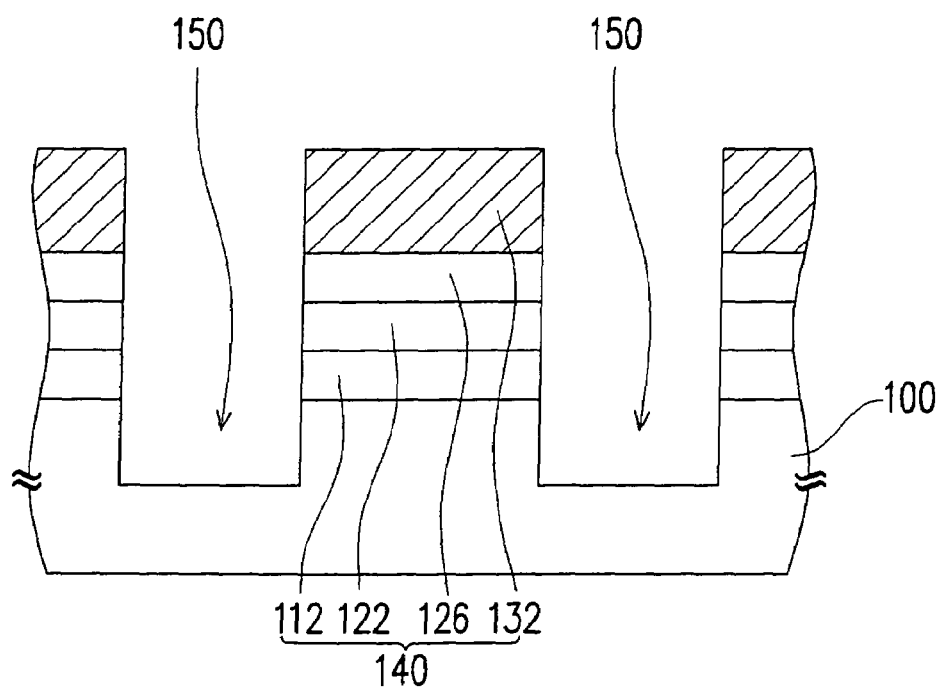

Next, please refer to FIG. 1B, a stacked gate structure 140 is formed on the substrate 100 between the openings 150. The stacked gate structure 140 comprises a dielectric layer 112, a charge storage layer 122, a dielectric layer 126 and a first conductive layer 132. A material of the dielectric layer 112 comprises silicon dioxide, and a material of the dielectric layer 126 comprises silicon dioxide, silicon dioxide/silicon nitride/silicon dioxide or other suitable dielectric material. A material of the first conductive layer 132 comprises polysilicon or doped polysilicon. In one embodiment, a material of the charge storage layer 122 comprises silicon nitride, and the dielectric layer 112, the charge storage layer 122 and the dielectric layer 126 constitute an oxide-nitride-oxide (O—N—O) layer. In another embodiment, a material of the charge storage layer 122 comprises polysilicon or doped polysilicon. The charge storage layer 122 serves as a floating gate, and the first conductive layer 132 is adapted for controlling the gate.

Figure 1C:
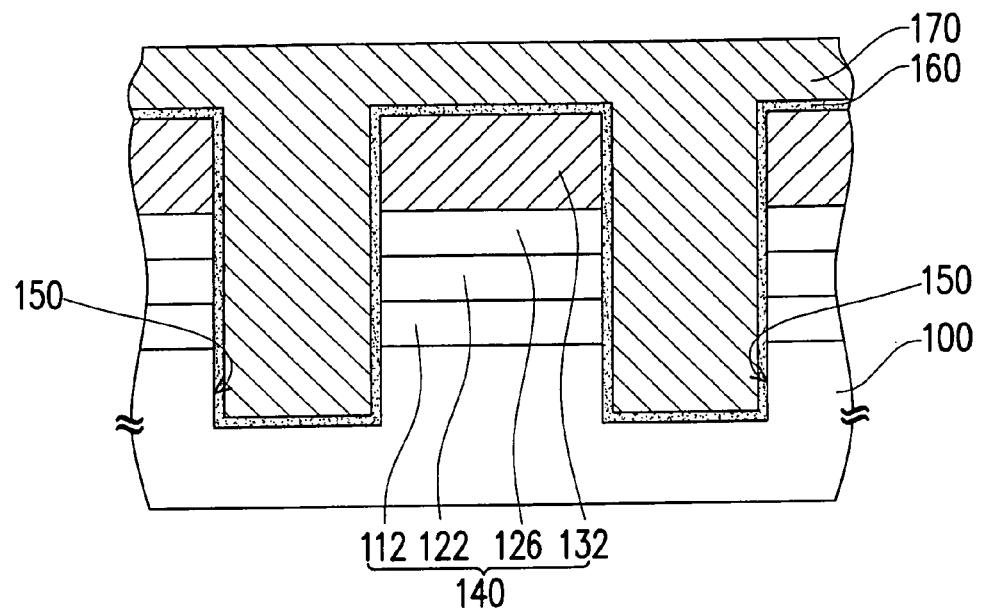

Next, referring to FIG. 1C, a liner 160 is formed on the substrate 100, wherein the liner 160 covers each of the two openings 150 and a surface of the stacked gate structure 140 compliantly. A material of the liner comprises silicon dioxide, silicon nitride or silicon oxynitride, and the method of forming the liner comprises an in-situ steam generated (ISSG) process or a chemical vapor deposition process. Next, a conductive material layer 170 is formed on the liner 160 at a bottom of each of the two openings 150, and each of the two openings 150 is filled with the conductive material layer 170. A material of the conductive material layer 170 comprises doped poly silicon.

Figure 1D:
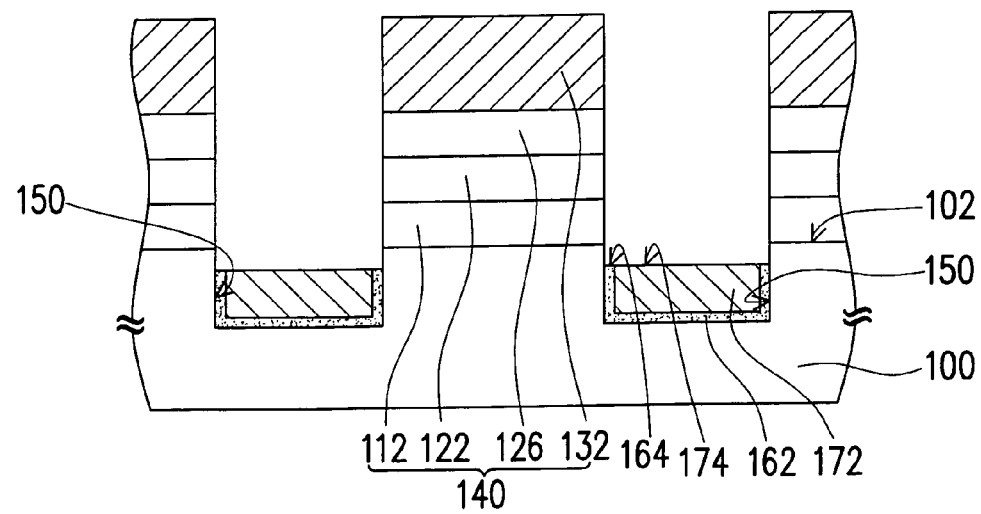

Next, referring to FIG. 1D, a portion of the conductive material layer 170 is removed to form a second conductive layer 172, and a top surface 174 of the second conductive layer 172 is lower than a top surface 102 of the substrate 100. A portion of the conductive material layer 170 is removed by, for example, an etching process. Next, a portion of the liner 160 is removed to form a liner 162, and a top surface 164 of the liner 162 is co-planar with the top surface 174 of the second conductive layer 172. A portion of the liner 160 is removed by, for example, an etching process. More specifically, the top surface 164 of the liner 162 is lower than the top surface 102 of the substrate 100 such that a channel region is formed between a subsequently formed source/drain region.

In light of the above, the liner 162 may prevent the dopant of the second conductive layer 172 from diffusing into the substrate 100, which may cause the electrical conduction within a depletion region and generate a punch through problem.

Figure 1E:
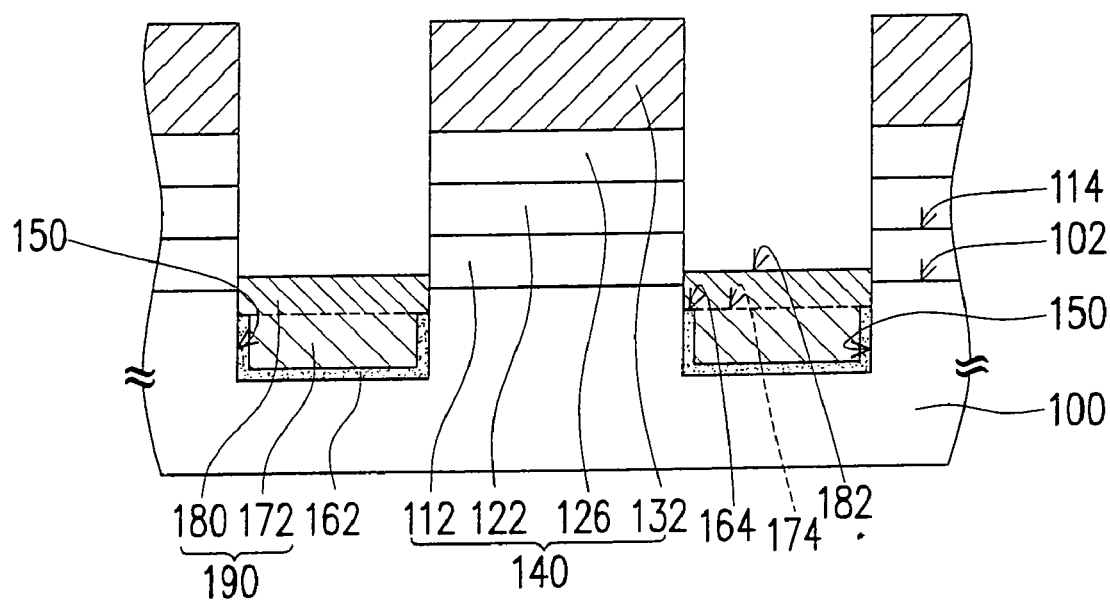

Next, referring to FIG. 1E, a third conductive layer 180 is formed on the second conductive layer 172 and the liner 162. A top surface 182 of the third conductive layer 180 is at least co-planar with the top surface 102 of the substrate 100 and is lower than a top surface 114 of the dielectric layer 112. A material of the third conductive layer 180 comprises doped poly silicon. The method of fabricating the third conductive layer 180 comprises the following steps. First, a conductive material layer (not shown) is formed on the substrate 100, and the conductive material layer at least fills each of the two openings 150. Then, a portion of the conductive material layer is removed, and until a top surface of the conductive material layer is at least substantially co-planar with the top surface 102 of the substrate 100 and lower than the top surface 114 of the dielectric layer 112 to form the third conductive layer 180. The above-mentioned second conductive layer 172 and the third conductive layer 180 may serve as a source/drain region 190 of the non-volatile memory, which is the so-called trench-like source/drain (S/D).

Particularly, the top surface 182 of the third conductive layer 180 is at least co-planar with the top surface 102 of the substrate 100, which may prevent a channel region between the source/drain region 192 from being exposed and avoid current leakage. Besides, the top surface 182 of the third conductive layer 180 is lower than the top surface 114 of the dielectric layer 112, which may avoid the electrical conduction with the first conductive layer 122 and the short of the device.

Of course, the present invention is not limited to the fabrication of the memory devices, but also can be applied to the fabrication of the semiconductor device such as metal oxide semiconductors. In addition, the present invention may be integrated with the fabrication of the periphery circuit region such that they can be fabricated on the same wager to form a non-volatile memory having a memory cell region and a periphery circuit region simultaneously. Furthermore, the present invention may also be applied to other suitable processes such as a PACAND process.

Instead of an ion-implantation process, the fabrication of the source/drain region 192 of the present invention is to form the openings 150 in the substrate 100 at the predetermined source/drain region 192 by an etching process, and then each of the openings 150 is filled with the conductive layer 190 made of doped poly silicon. The bottom and a portion of a sidewall of the conductive layer 190 are covered by the liner 162, to prevent the dopant within the source/drain region from diffusing. The source/drain region 192 which is not covered by the liner 162 is electrically conductive. Therefore, the problem of punch through can be avoided, leading to higher reliability and the yield of the device.

The non-volatile memory shown in FIG. 1E according to an embodiment of the present invention is illustrated as follows.

Referring to FIG. 1E again, the non-volatile memory comprises a substrate 100, a stacked gate structure 140, a liner 162, a second conductive layer 172 and a third conductive layer 180. The substrate 100 comprises two openings 150. The stacked gate structure 140 is disposed on the substrate 100 between the two openings 150, and comprises the dielectric layer 112, the charge storage layer 122, the dielectric layer 126 and the first conductive layer 132. A material of the dielectric layer 112 and the dielectric layer 126 comprises silicon dioxide or other suitable dielectric material. A material of the first conductive layer 132 comprises polysilicon or doped polysilicon. In one embodiment, a material of the charge storage layer 122 comprises silicon nitride, and the dielectric layer 112, the charge storage layer 122 and the dielectric layer 126 constitute an oxide-nitride-oxide (O—N—O) layer. In another embodiment, a material of the charge storage layer 122 comprises polysilicon or doped polysilicon. The charge storage layer 122 serves as a floating gate, and the first conductive layer 132 is adapted for controlling the gate.

The liner 162 is disposed on a bottom of each of the two openings 150 and a portion of a sidewall of each of the two openings 150, and a top surface 164 of the liner 162 is lower than a top surface 102 of the substrate 100. A material of the liner 162 comprises silicon dioxide, silicon nitride or silicon oxynitride. The second conductive layer 172 is disposed on the liner 162 at the bottom of each of the two openings 150, and a top surface 174 of the second conductive layer 172 is co-planar with the top surface 164 of the liner 162. A material of the second conductive layer 172 comprises doped poly silicon. The third conductive layer 180 is disposed on the second conductive layer 172 and the liner 162, wherein a top surface 182 of the third conductive layer 180 is at least co-planar with the top surface 102 of the substrate 100 and lower than a top surface 114 of the dielectric layer 112. A material of the third conductive layer 180 comprises doped poly silicon. The above-mentioned second conductive layer 172 and the third conductive layer 180 may serve as a source/drain region 190 of the non-volatile memory, which is the so-called trench-like source/drain (S/D).

In summary, the non-volatile memory of the present invention utilizes the trench type source/drain region to replace the conventional source/drain region formed by ion implantation. The non-volatile memory employs the trench structure to prevent the dopant within the source/drain region from diffusing into the substrate, which may cause a punch through between the source/drain region. Thus, the efficiency and the reliability of the device may be effectively promoted. The structure of the non-volatile memory and the fabrication method thereof provided by the present invention may also integrate the fabrication of the memory cell region and the periphery circuit region of the non-volatile memory, and can be used to other suitable processes such as a floating gate process.

It will be apparent to those skilled in the art that various modifications and variations can be made to the structure of the present invention without departing from the scope or spirit of the invenition. In view of the foregoing, it is intended that the present invention cover modifications and variations of this invention provided they fall within the scope of the following claims and their equivalents.

What is claimed is:

1. A method of fabricating a non-volatile memory, comprising the following steps:
    forming two openings on a substrate;
    forming a stacked gate structure on the substrate between the two openings, wherein the stacked gate structure comprises a first dielectric layer, a charge storage layer, a second dielectric layer and a first conductive layer;
    forming a liner on a bottom of each of the two openings and a portion of a sidewall of each of the two openings, wherein a top surface of the liner is lower than that of the substrate;
    forming a second conductive layer on the liner at the bottom of each of the two openings, wherein a top surface of the second conductive layer is co-planar with that of the liner; and
    forming a third conductive layer on the second conductive layer and the liner, wherein a top surface of the third conductive layer is at least co-planar with that of the substrate and lower than that of the first dielectric layer.

2. The method of fabricating a non-volatile memory according to claim 1, wherein the method of forming the liner comprises in-situ steam generated (ISSG) process or a chemical vapor deposition process.

3. The method of fabricating a non-volatile memory according to claim 1, wherein a material of the liner comprises silicon dioxide, silicon nitride or silicon oxynitride.

4. The method of fabricating a non-volatile memory according to claim 1, wherein a material of the second conductive layer comprises doped polysilicon.

5. The method of fabricating a non-volatile memory according to claim 1, wherein the method of forming the third conductive layer comprises:
    forming a conductive material layer on the substrate to at least fill the two openings; and
    removing a portion of the conductive material layer until a top surface of the conductive material layer is at least co-planar with the top surface of the substrate and lower than that of the first dielectric layer.

6. The method of fabricating a non-volatile memory according to claim 1, wherein a material of the third conductive layer comprises doped polysilicon.

7. The method of fabricating a non-volatile memory according to claim 1, wherein a material of the charge storage layer comprises silicon nitride.

8. The method of fabricating a non-volatile memory according to claim 1, wherein a material of the first dielectric layer comprises silicon dioxide.

9. The method of fabricating a non-volatile memory according to claim 1, wherein a material of the first conductive layer comprises poly silicon or doped poly silicon.

10. The method of fabricating a non-volatile memory according to claim 1, wherein the charge storage layer comprises poly silicon or doped poly silicon.

11. The method of fabricating a non-volatile memory according to claim 1, wherein the second dielectric layer comprises silicon dioxide or silicon dioxide/silicon nitride/silicon dioxide.

* * * * *